(12) United States Patent
Ireland et al.

(10) Patent No.: US 6,331,379 B1
(45) Date of Patent: Dec. 18, 2001

(54) PHOTO-LITHOGRAPHY PROCESS USING MULTIPLE ANTI-REFLECTIVE COATINGS

(75) Inventors: Philip J. Ireland, Nampa; Thomas R. Glass, Idaho City; Gurtej Sandhu, Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/387,775

(22) Filed: Sep. 1, 1999

(51) Int. Cl.[7] ................................................ G03F 7/00
(52) U.S. Cl. ..................... 430/314; 430/311; 430/317; 430/320; 430/324; 430/950
(58) Field of Search ................................ 430/311, 314, 430/317, 320, 324, 950

(56) References Cited

U.S. PATENT DOCUMENTS

| | | | |
|---|---|---|---|
| 5,527,739 | 6/1996 | Parrillo et al. | 437/198 |
| 5,733,712 | * 3/1998 | Tanaka | 430/314 |
| 5,741,626 | 4/1998 | Jain et al. | 430/314 |
| 5,763,327 | 6/1998 | Blasingame et al. | 438/717 |
| 5,821,160 | 10/1998 | Rodriguez et al. | 438/601 |

* cited by examiner

*Primary Examiner*—Mark F. Huff
*Assistant Examiner*—Nicole Barreca
(74) *Attorney, Agent, or Firm*—Dickstein Shapiro Morin & Oshinsky LLP

(57) ABSTRACT

A method for fabricating an integrated circuit using a photo-lithographic process includes the steps of placing at least two anti-reflective coating layers between a reflective surface and another material. The indices of refraction, absorptions, and thicknesses of the at least two anti-reflective coating layers are chosen such that the amplitudes and phase differences of radiation reflected from the anti-reflective coating, layers, as well as any other reflective surfaces below the anti-reflective coating layers, mutually cancel when combined. The invention may be practiced using more than two layers of anti-reflective coating. Multiple layers of anti-reflective coating may be used below an inter-level dielectric, in which case they may serve the additional purpose of functioning as an etch-stop.

32 Claims, 17 Drawing Sheets

PHOTO-LITHOGRAPHY PROCESS USING MULTIPLE ANTI-REFLECTIVE COATINGS

BACKGROUND OF THE INVENTION

1. Field of the Invention

The present invention relates generally to the field of integrated circuit fabrication, and more specifically to the use of dielectric anti-reflective coatings in integrated circuit fabrication processes.

2. Description of the Related Art

The semiconductor industry's drive toward increasingly smaller integrated circuit geometries has led to the use of photolithography processes that employ radiation with increasingly shorter wavelengths. More specifically, in order to achieve sufficient resolution, deep submicron (less than approximately 0.5 micron) applications require the use of deep ultraviolet (DUV) radiation with wavelengths of, for example, approximately 248 nanometers, as compared to G-line (approximately 436 nanometers) or I-line (approximately 365 nanometers) radiation.

However, the use of DUW radiation has led to problems. In particular, reflections from underlying layers of metals, metal silicides and polysilicon during exposure has led to problems such as higher CD variances from area to area, standing wave effects and the well-documented "footing" problem. The formation of standing waves reduces critical dimension control and causes large linewidtlh variations over device topography. These problems are exacerbated by the increased reflectivity exhibited by many materials in the presence of DUV radiation. These problems are particularly severe in areas where the reflective surface topography is "stepped" (where the reflective surface is rising or falling, such as at the edges of a gate stack).

These problems have led to the use of anti-reflective coatings. Anti-reflective coatings are typically deposited on a substrate below a photoresist layer to control reflection of DUV radiation off of surfaces below the anti-reflective coating and thereby minimize the problems associated therewith. While helpful, known anti-reflective coatings are not completely effective in controlling undesirable reflections.

One problem with the use of anti-reflective coatings is that they are typically opaque and have a high absorption value and index of refraction, while the materials above the anti-reflective coatings are typically transparent and have a lower absorption value and lower index of refraction. For example, a thin film of opaque anti-reflective coating is often used beneath a transparent inter-level dielectric layer. A dielectric anti-reflective coating, or DARC may be used beneath inter-level dielectric layers.

The problem with using an anti-reflective coating in this manner is that the interface between the bottom surface of the dielectric and the top surface of the anti-reflective coating causes a reflection due to the index of refraction mismatch. Thus, although the DARC may be totally effective in preventing any radiation penetrating its upper surface from being reflected off of surfaces below the DARC, some radiation will be reflected off of the DARC/dielectric layer interface. This reflected radiation causes the aforementioned problems.

A second problem associated with anti-reflective coatings is that, for various reasons not of concern here, the integrated circuit fabrication process is such that the thickness of the anti-reflective coating must be thinner than the thickness required to completely prevent radiation from reflecting off surfaces below the anti-reflective coating and back.

What is needed is an anti-reflective coating that reduces reflections from surfaces beneath the anti-reflective coating as well as reflections from the upper surface of the anti-reflective coating itself.

SUMMARY OF THE INVENTION

The present invention overcomes to a great extent the aforementioned problems by providing a multiple layer anti-reflective coating. The upper layer of anti-reflective coating has an absorption and index of refraction that allows at least some radiation to penetrate it, reflect off the interface between the upper anti-reflective coating layer and lower anti-reflective coating layer, and pass back through the upper layer. In this manner, there will be at least two interfaces from which radiation is reflected: 1) the interface between the upper surface of the upper anti-reflective coating layer and whatever material (e.g. dielectric, photoresist) is above it, and 2) the interface between the lower surface of the upper anti-reflective coating layer and the upper surface of the lower anti-reflective coating layer. The thickness, index of refraction and absorption value of the upper layer are chosen such that the amplitudes of the radiation reflected from the two interfaces are approximately equal, but the phase difference between the radiation is approximately 180 degrees so that the reflections cancel each other. There may also be radiation reflected from reflective surfaces which reside below the anti-reflective coating layers, depending upon the thickness and absorption of the layers. In this case, the thicknesses, indices of refraction and absorption values are chosen such that the amplitudes and phase difference from the three sources of reflected radiation mutually cancel when combined. Thus, the total reflected radiation may be greatly reduced. A second benefit that is realized is that variations in reflectivity due to differences in thickness of other layers of materials, such as dielectrics, is greatly reduced. This reduction in sensitivity, or increased process margin, is especially important where the geometry of the substrate is complex.

The anti-reflective coating layers may also be used as an etch stop in the integrated circuit fabrication process. For example, a multiple layer DARC may function as an etch stop when an inter-level dielectric is etched to create a path to the bit line contact in a conventional bit-line over capacitor DRAM cell fabrication process.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF THE PREFERRED EMBODIMENTS

The present invention will be illustrated through a description of the photolithographic patterning of a reflective layer and the fabrication of conventional dual bit-line over contact DRAM cells. Numerous specific details, such as materials, thicknesses, etc., are set forth in order to provide a thorough understanding of the present invention. It will be obvious, however, to one skilled in the art that the present invention may take many different forms and that the present invention may be practiced without the specific details set forth herein. Accordingly, the drawings and description herein are to be regarded as illustrative in nature and not as restrictive.

The term "wafer" is to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in the base semiconductor structure or foundation. In addition, the semiconductor need not be silicon-based, but could be based on silicon-germanium, germanium, or gallium arsenide.

Figure 1:
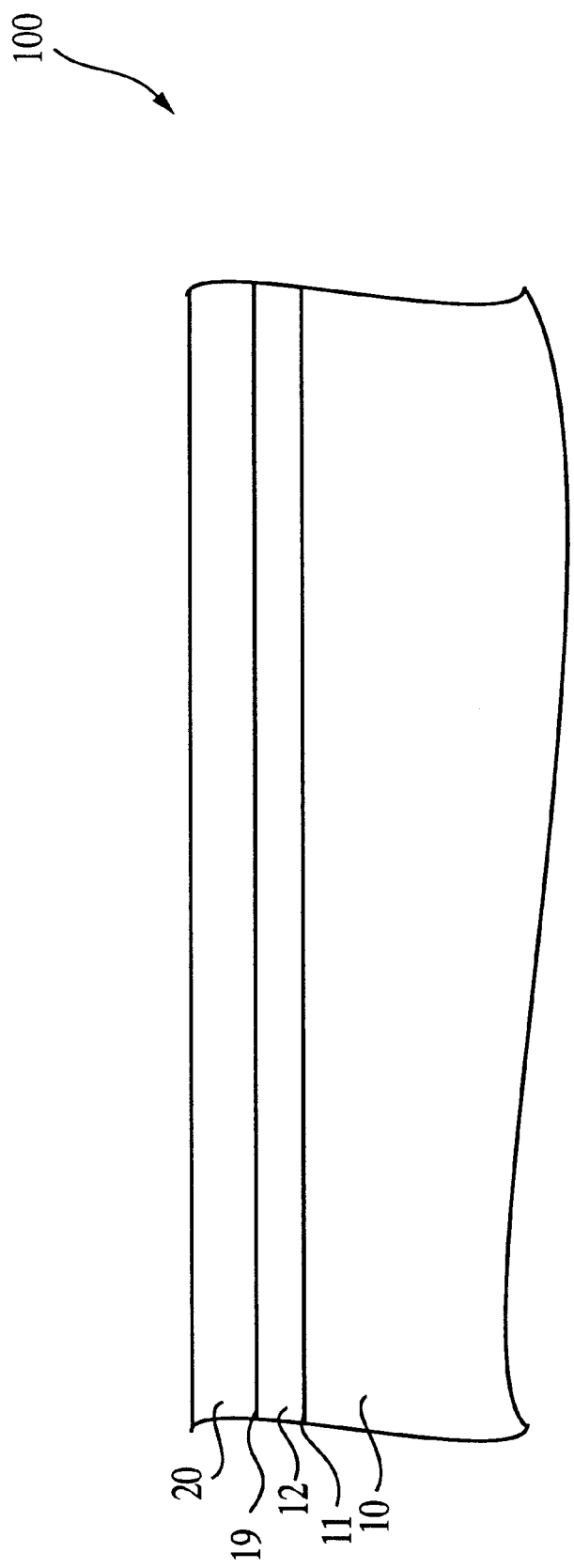
FIG. 1 is a cross-sectional diagram of a portion of a reflective layer with an anti-reflective coating and a layer of photoresist as taught by the prior art.

A cross-sectional view of a portion 100 of a wafer under fabrication is shown. A reflective layer 10 as provided on an Lipper surface of the wafer 100 is illustrated in FIG. 1. The reflective layer may be conductive or non-conductive, and may be comprised of a metal, a metal silicide, polysilicon, or numerous other materials. The layer 10 has been coated with a single layer 12 of anti-reflective coating as is known in the art. A layer 20 of photoresist is applied over the anti-reflective coating layer 12. After the photoresist has been applied, it is ready for selective exposure to radiation, such as DUV radiation, so that a desired pattern can be formed in the photoresist layer 20 and subsequently transferred to the reflective layer 10 in any number of conventional photolithographic procedures which are well known in the art.

This method, although generally effective in reducing reflection from the reflective layer 10, is not totally effective. First, the anti-reflective coating layer 12 may not be thick enough and/or have a high enough absorption, or k value, to prevent some radiation from penetrating the anti-reflective coating layer 12, reflecting off the top surface 11 of the reflective layer 10, and back through the anti-reflective coating layer 12 and into the photoresist layer 20. Second, some radiation will be reflected off of the interface 19 between the anti-reflective coating layer 12 and the photoresist layer 20.

Figure 2:
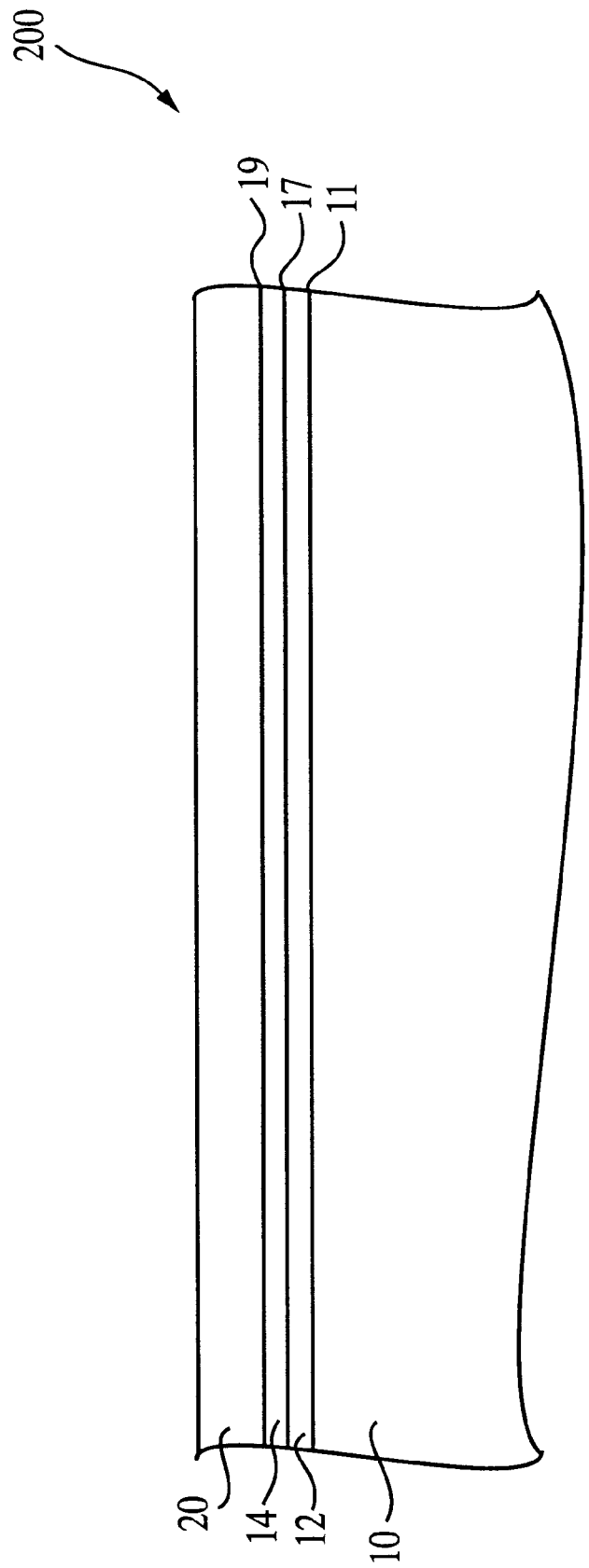
FIG. 2 is a cross-sectional diagram of a portion of a reflective layer with dual layers of anti-reflective coating and a layer of photoresist according to one embodiment of the invention.

FIG. 2 illustrates a first embodiment 200 of the invention in which two layers of anti-reflective coating 12, 14 are placed between the reflective layer 10 and the photoresist layer 20. The upper layer 14 of the anti-reflective coating has an absorption low enough such that a first portion of the radiation incident upon the upper anti-reflective coating layer 14 passes through it, reflects off of the interface 17 between the upper anti-reflective coating layer 14 and the lower anti-reflective coating layer 12, and passes back through the upper anti-reflective coating layer 14 into the photoresist layer 20. A second portion of the radiation incident upon the upper anti-reflective coating layer 14 will also be reflected back into the photoresist layer 20 by the interface 19 of the photoresist layer 20 and the upper layer 14. However, the thickness, index of refraction and absorption, of the upper layer 14 is chosen such that the amplitudes of the first and second portions of reflected radiation are approximately equal, but the phase difference between the first and second portions is approximately 180 degrees different, such that the portions destructively interfere with, or cancel, each other.

The foregoing discussion assumes that the combined thickness and absorption of the upper anti-reflective coating layer 12 and lower anti-reflective coating layer 14 is such that little or no radiation is reflected from the reflective layer 10 into the photoresist layer 20. If this assumption is incorrect, then the thicknesses, absorptions, and indices of refraction of upper layer 12 and lower layer 14 are chosen such that reflected radiation from all three sources (the interfaces 19 and 17 and the upper surface 11 of the reflective layer 10) mutually cancel each other.

Determining the proper thicknesses, indices of refraction and absorptions of layers 12 and 14 is not simple. If the indices of refraction and absorptions of the photoresist 20, upper layer 12, and lower layer 14 were equal and the photoresist 20 and layers 12 and 14 were transparent, and one were only considering radiation reflected from interfaces 17 and 19, then the thickness of the upper layer 12 would simply be chosen to be one quarter of the wavelength of the radiation in the photoresist and upper and lower layers. This result can be explained as follows: in order for the radiation from two sources to be 180 degrees out of phase, the path traveled by the radiation must be different by one half of the wavelength (or some multiple thereof). Because radiation passes through the upper layer 14 twice (to and from the interface 17), an upper layer 14 thickness of one quarter wavelength results in a difference of one half wavelength between the path traveled by the first and second portions of the radiation.

However, the present situation is more complicated. First, the indices of refraction of the photoresist 20 and layers 12 and 14 are not equal. This means that the wavelengths of the radiation in these materials will not be equal. Second, a phase shift occurs when light is reflected off of the interface between materials with different indices of refraction. (Calculating this phase shift itself is difficult. Information on how to calculate this phase shift may be found in books such as *Optical Properties of Thin Solid Films*, by O. S. Heavens [Butterworth's, London, 1955]) Third, it may not be possible or desirable to ignore the light reflected from the layer 10. Fourth, upper layer 12 and lower layer 14 are not transparent. Therefore, balancing the amplitudes as well as the phase differences is not trivial, especially when one considers that the index of refraction and absorption values are not independent.

Determining what types of upper and lower anti-reflective coatings (each with its own absorption value and index of refraction) to use, as well as what the thicknesses of the coatings should be, is greatly simplified by use of commercially available lithography modeling programs, such as PROLITH/2™. Such programs will allow a user to model the reflectivity of structures such as the structure of FIG. 2 with various anti-reflective coatings and thicknesses. By varying the materials and thicknesses, an acceptable solution for achieving a set of desired reflective properties may be obtained with reasonable effort. More complicated structures may also be modeled by including additional anti-reflective coating layers and/or additional layers of other materials with reflective surfaces.

One method for using the modeling software to choose anti-reflective coatings and materials with desired reflective properties is as follows. First, select an opaque or nearly opaque anti-reflective coating as the lower layer. Second, select the thickness of the anti-reflective coating to slightly less than the greatest allowable (in light of the requirements of the fabrication process) thickness. Next, choose an anti-reflective coating with a different index of refraction for the upper layer. Then, set the thickness of the upper layer such the combined thickness of the upper and lower layers is approximately equal to the maximum allowable anti-reflective coating thickness. Then simply adjust the thicknesses, absorptions, and indices of refraction of the upper and lower anti-reflective coating layers until an acceptable solution is found.

Note that it may be desirable to adjust the absorption and index of refraction of an anti-reflective coating layer in a limited manner so that selected combination of absorption and index of refraction always represents a known anti-reflective coating material. Also, it may be possible to achieve a desired set of reflective properties, by adjusting only the thicknesses of the layers, only the absorptions of the layers, only the indices of refraction of the layers, or only a combination of two of these three characteristics. For example, adjusting the thickness, absorption, and index of refraction of a layer to achieve a desired set of reflective properties may comprise modifying only the thickness and absorption of the layer while leaving the index of refraction unchanged. Other possible types of adjustments will be apparent to those skilled in the art.

The use of two layers of anti-reflective coating results in increased process margin as well as lower reflectivities. As used herein, "process margin" refers to tolerance to variations in process parameters such as thickness. Thus, all increased process margin means that the reflectivity achieved is less sensitive to process variations such as thicknesses in dielectric layers either above or below the anti-reflective coating layers.

FIGS. 9–12 illustrate the performance enhancements that can be realized through the use of dual anti-reflective coating layers. Each of these figures was produced using the ProLith/2™ modeling program. Each of the simulations assumes the following structure: a silicon substrate, a thick (approximately 2500 nm) layer of silicon dioxide (silicon dioxide, like BPSG, is transparent) over the silicon layer, one or more layers of anti-reflective coating over the thick silicon dioxide layer, a thin layer of silicon dioxide over the anti-reflective coating layer or layers, and a layer of photoresist approximately 645 nm thick over the thin silicon dioxide layer. The simulations performed to generate the data in FIGS. 9–12 represent exposing the substrate to light with a wavelength of 248 nm in vacuum.

Figure 9:
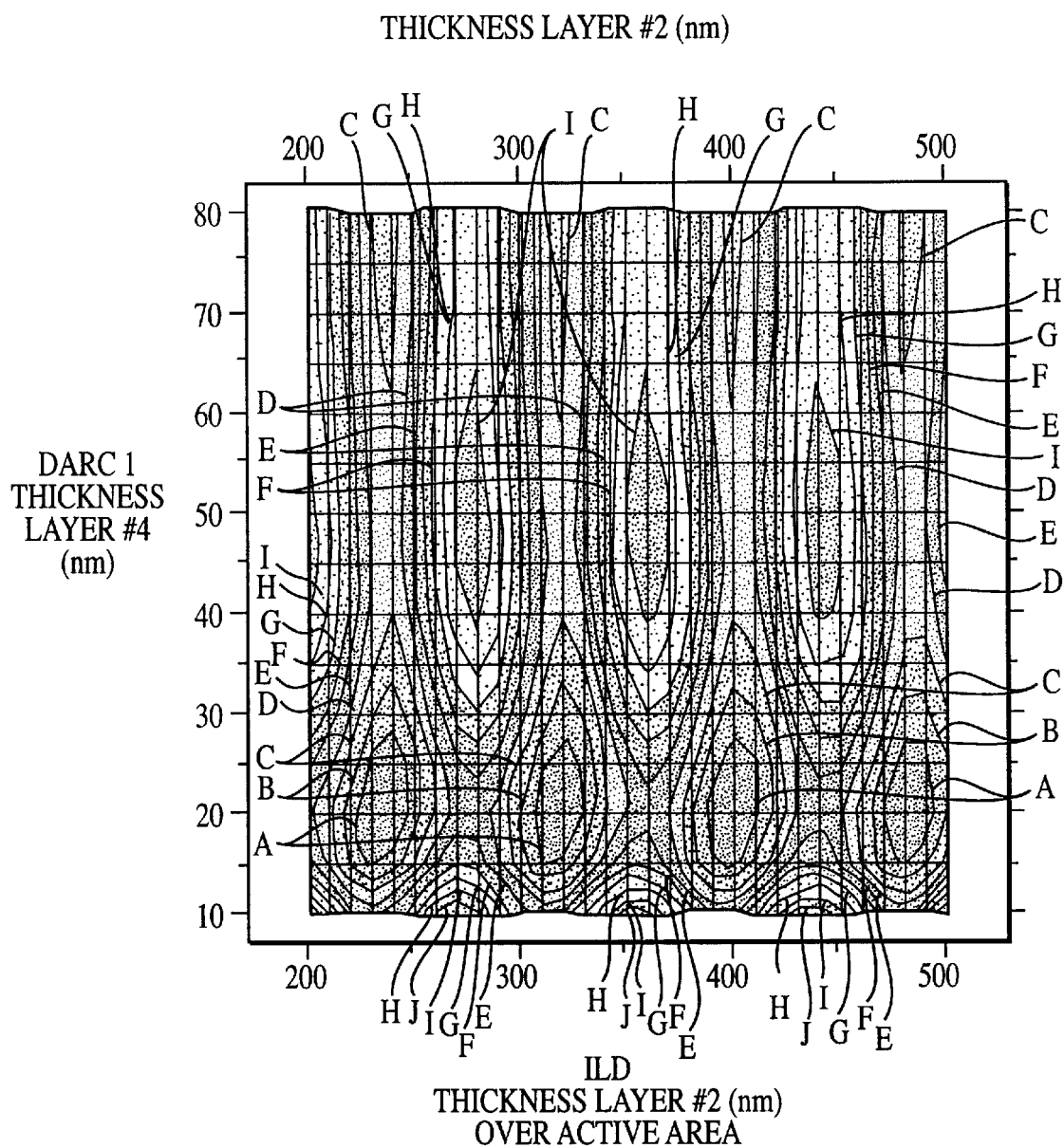
FIG. 9 is a contour diagram showing the performance of a single, thin anti-reflective coating layer.

FIG. 9 is a contour diagram of a simulation showing the total reflectivity when the structure described above includes a single layer of DARC1 between the thin and thick layers of silicon dioxide. The DARC1 coating has an approximate index of refraction n=2.1 and an approximate absorption k=1.2. In the simulations represented by FIG. 9, the thickness of the DARC1 coating is allowed to vary between 10 nm and 80 nm, while the thickness of the thin layer of silicon dioxide is allowed to vary between 200 and 500 nm.

The contours of FIG. 9 have the following values:

| Contour | Reflectivity |
| --- | --- |
| A | 0.044 |
| B | 0.061 |
| C | 0.079 |
| D | 0.097 |
| E | 0.115 |
| F | 0.132 |
| G | 0.150 |
| H | 0.168 |
| I | 0.185 |
| J | 0.203 |

As seen in FIG. 9, the reflectivity ranges from 0.044 to 0.203. Note that the reflectivity performance of the DARC1 coating is periodic, alternatively showing minimum and maximum reflectivity behavior as the thickness of thin silicon dioxide layer changes. Previous experience has shown that, for some processes, the performance of DARC1 coating is not sufficient.

Figure 10:
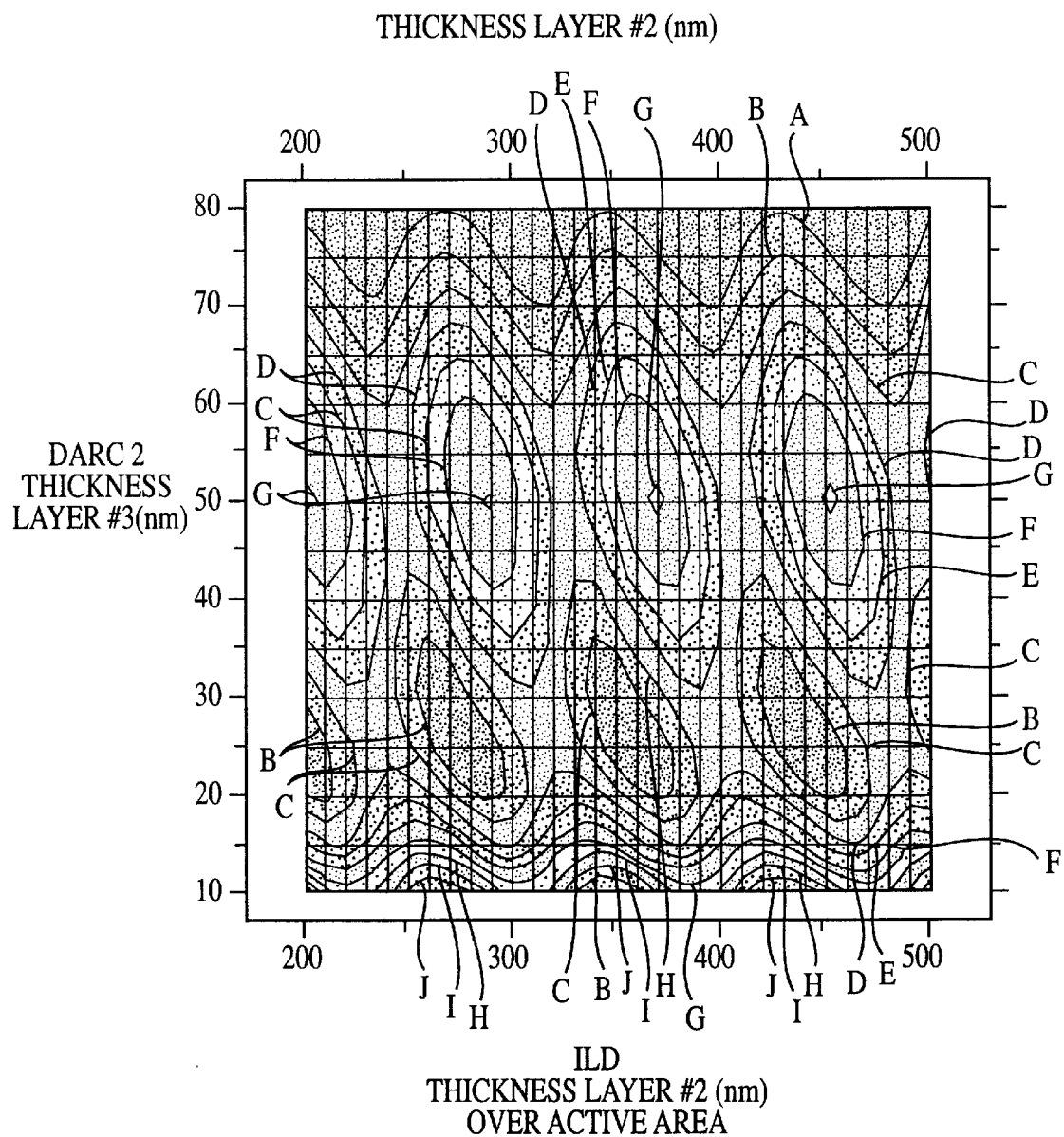
FIG. 10 is a contour diagram showing the performance of a single, thin anti-reflective coating layer of an alternate composition.

FIG. 10 is a contour diagram of a simulation showing the total reflectivity into the photoresist when the structure described above includes a single layer of DARC2 between the thin and thick layers of silicon dioxide. The DARC2 coating has an approximate index of refraction n=2.0 and an approximate absorption k=0.3. In the simulations represented by FIG. 10, the thickness of the DARC2 coating is allowed to vary between 10 nm and 80 nm, while the thickness of the thin layer of silicon dioxide is allowed to vary between 200 and 500 nm.

The contours of FIG. 10 have the following values:

| Contour | Reflectivity |
| --- | --- |
| A | 0.035 |
| B | 0.069 |
| C | 0.104 |
| D | 0.139 |
| E | 0.174 |
| F | 0.208 |
| G | 0.243 |
| H | 0.278 |
| I | 0.312 |
| J | 0.347 |

As seen in FIG. 10, the reflectivity ranges from 0.035 to 0.347. The reflectivity performance of the DARC2 coating also exhibits periodic character. The performance of the DARC2 coating is improved compared to the DARC1 coating at some thickness combinations, but the DARC2 coating also shows greater variation in performance with changing thickness. As for the DARC1 coating, previous experience has shown that, for some processes, the performance of DARC2 coating is not sufficient.

Figure 11:
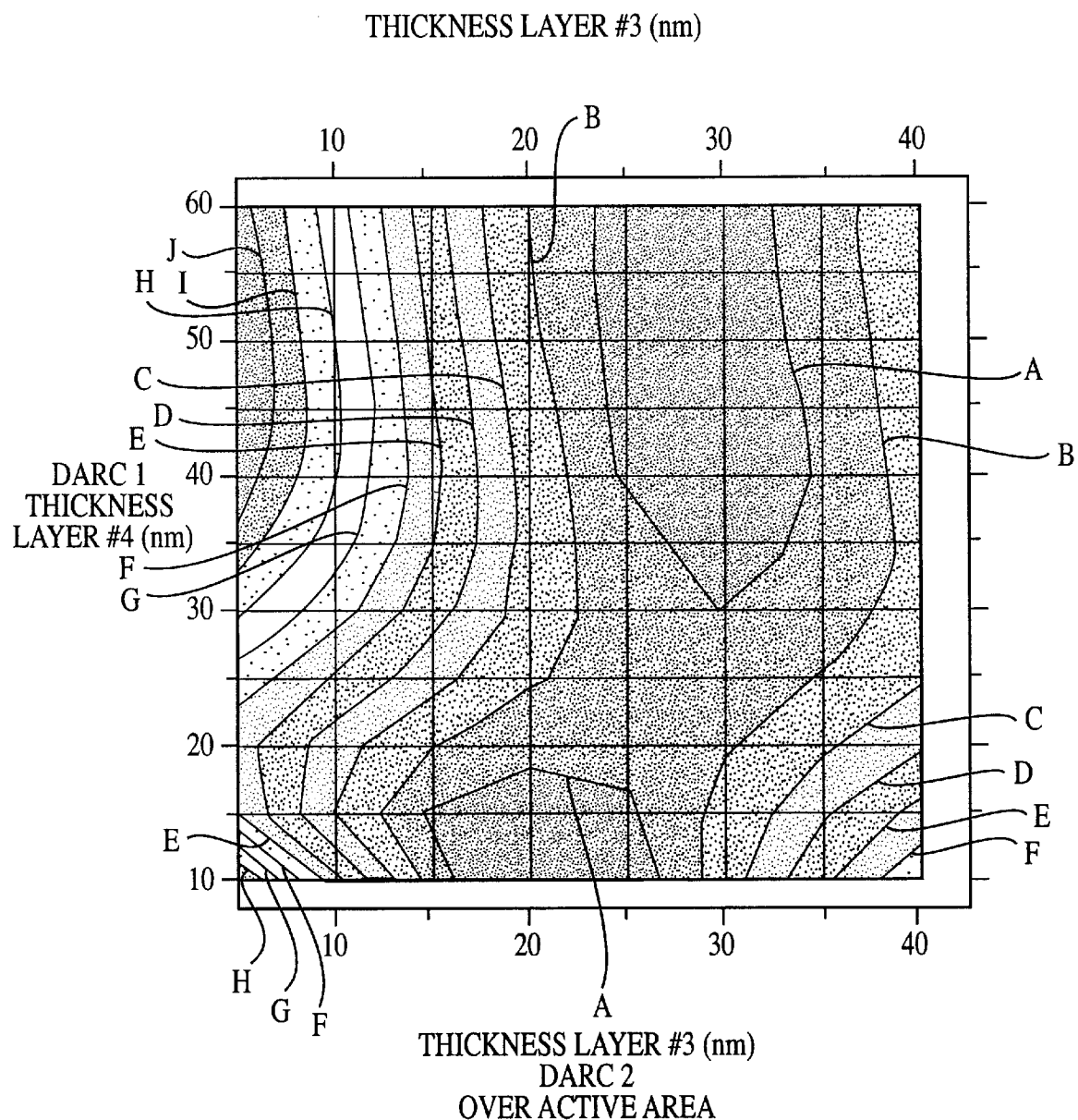
FIG. 11 is a contour diagram showing the performance of dual, thin anti-reflective coating layers.

FIG. 11 illustrates the results achieved through the use of two layers of anti-reflective coating. FIG. 11 is another contour diagram of a simulation showing the reflectivity of DARC1 and DARC2 layers of anti-reflective coating sandwiched between two silicon dioxide layers. In FIG. 11, the DARC1 and DARC2 layers have the same n and k values as the layers in FIGS. 9 and 10. The thickness of the thin silicon dioxide layer is fixed at 300 nm for the simulations depicted in FIG. 11. The DARC1 layer has a thickness ranging from 10 nm to 60 nm, while the DARC,2 layer has a thickness ranging from 10 nm to 40 nm.

The contours of FIG. 11 have the following values:

| Contour | Reflectivity |
| --- | --- |
| A | 0.015 |
| B | 0.028 |
| C | 0.042 |
| D | 0.056 |
| E | 0.070 |
| F | 0.084 |
| G | 0.098 |
| H | 0.112 |
| I | 0.126 |
| J | 0.140 |

The performance of the two layers of anti-reflective coating has improved in two ways as compared to the single layers of FIGS. 9 and 10. First, FIG. 11 shows that the absolute values of the reflectivity have been decreased such that the best performance for the dual anti-reflective coatings is a reflectivity value of 0.015, as opposed to reflectivity values of 0.044 and 0.035 for the singe anti-reflective coating layers. Thus, FIG. 11 demonstrates the ability of dual anti-reflective coating layers to reduce the absolute amount of reflected light for a structure having layers of fixed thickness.

Figure 12:
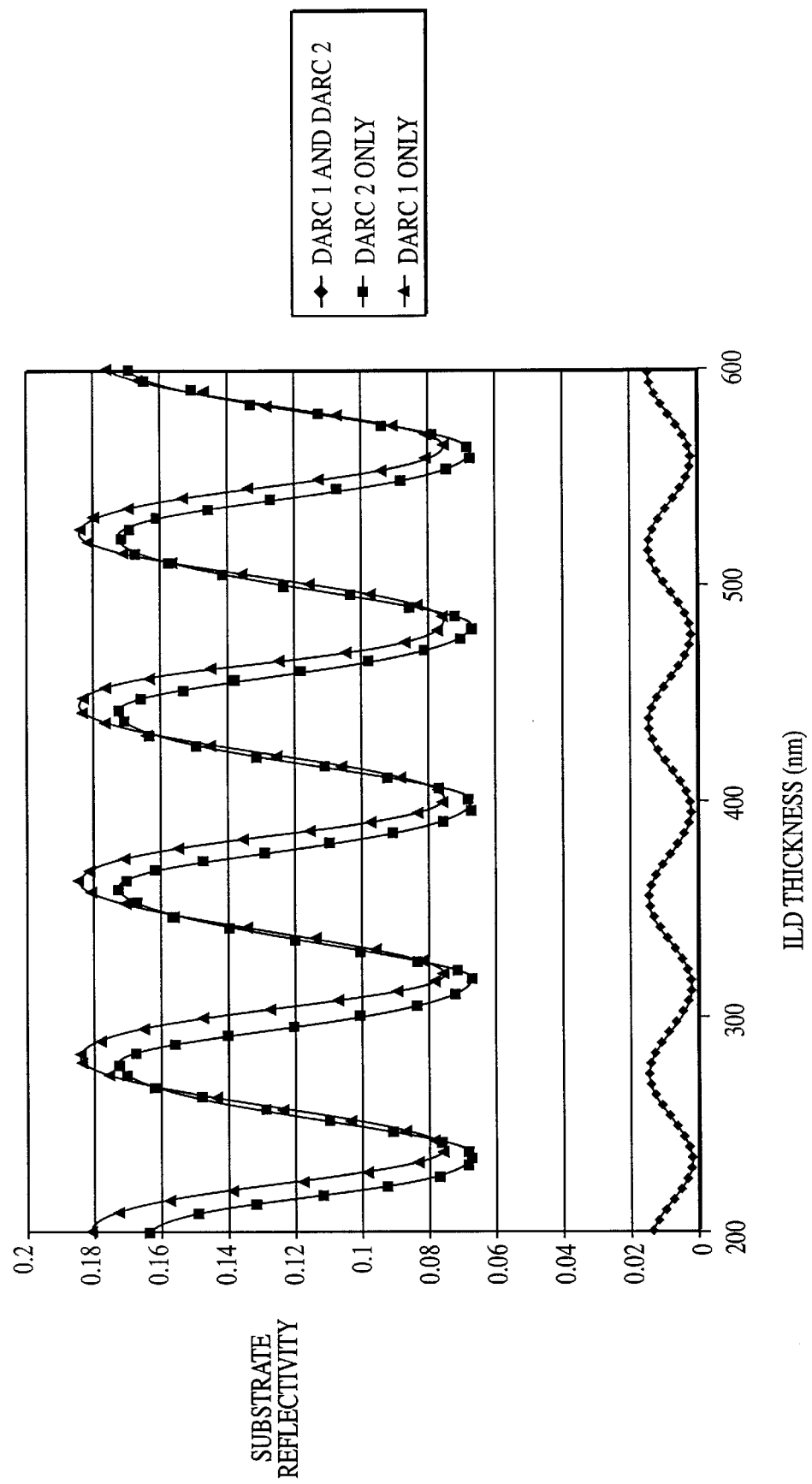
FIG. 12 shows a comparison of the performance of two different single, thin anti-reflective coating layers with the performance of dual, thin anti-reflective coating layers.

Second, FIG. 12 shows that there is less variation in reflectivity as a function of silicon dioxide layer thickness. FIG. 12 depicts the changes in the calculated reflectivity for substrates similar to those modeled in FIGS. 9, 10, and 11. In FIG. 12, the thickness of the single DARC1 layer is 40 nm while the thickness of the single DARC2 layer is 25 nm. These same thicknesses are also used for the DARC1 and DARC2 layers present in the substrate having dual anti-reflective coatings. As in FIGS. 9 and 10, the thickness of the thin dielectric layer is varied, but in FIG. 12 this variation is between 200 nm and 600 nm. FIG. 12 shows that dual anti-reflective coatings of an appropriate thickness provide improved performance that is largely independent of variations in the thickness of the thin dielectric layer. Thus, the dual anti-reflective coating layers described here reduce the sensitivity of this sample substrate to process variations.

FIGS. 13–16 illustrate the performance enhancements gained from the use of dual anti-reflective coating layers in an area of a substrate with polysilicon as the primary reflective layer, as opposed to the crystalline silicon used in the above simulations. Each of these figures was produced using the ProLith/2™ modeling program. Each of the simulations assumes the following structure: a silicon substrate, a thin (approximately 50 nm) layer of polysilicon, a first (approximately 300 nm) layer of silicon dioxide over the polysilicon layer, one or more layers of anti-reflective coating over the first silicon dioxide layer, a second layer of silicon dioxide over the anti-reflective coating layer or layers, and a layer of photoresist approximately 645 nm thick over the thin silicon dioxide layer. The calculations performed to generate the data in FIGS. 13–16 simulate exposing the substrate to light with a wavelength of 248 nm in vacuum.

Figure 13:
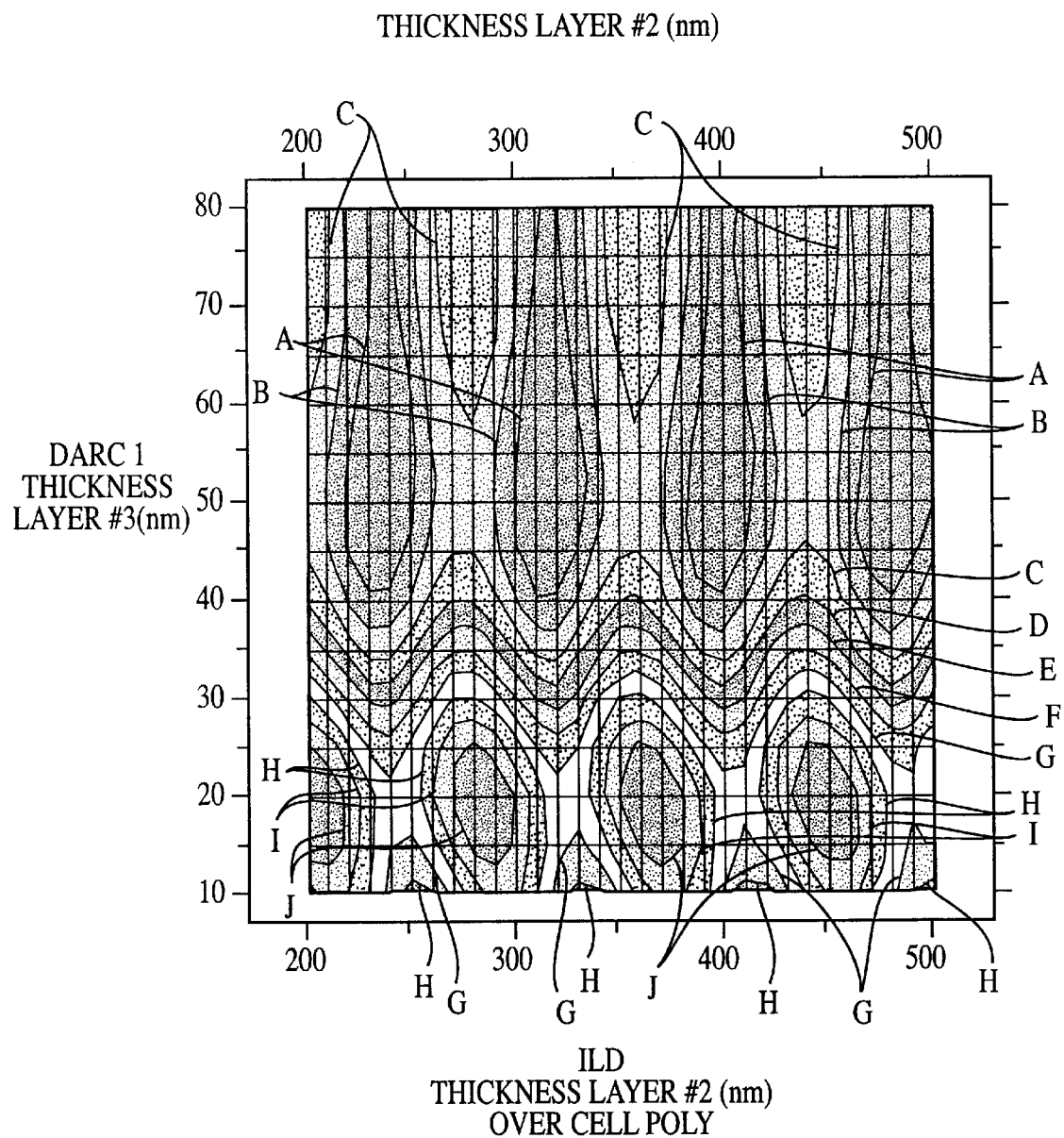
FIG. 13 is a contour diagram showing the performance of the single, thin anti-reflective coating layer in FIG. 9 over an alternate substrate material.

FIG. 13 is a contour diagram of a simulation showing the total reflectivity into the photoresist when the structure described above includes a single layer of DARC1 coating between the first and second layers of silicon dioxide. As before, the DARC1 coating has an approximate index of refraction n=2. 1 and an approximate absorption k=1.2. In the simulations represented by FIG. 13, the thickness of the DARC 1 coating is allowed to vary between 10 nm and 80 nm, while the thickness of the second layer of silicon dioxide is allowed to vary between 200 and 500 nm.

The contours of FIG. 13 have the following values:

| Contour | Reflectivity |
| --- | --- |
| A | 0.087 |
| B | 0.123 |
| C | 0.159 |
| D | 0.195 |
| E | 0.230 |
| F | 0.266 |
| G | 0.302 |
| H | 0.338 |
| I | 0.374 |
| J | 0.409 |

As seen in FIG. 13, the reflectivity ranges from 0.087 to 0.409. Once again, the reflectivity performance of the DARC1 coating is periodic, alternatively showing minimum and maximum reflectivity behavior as the thickness of second silicon dioxide layer changes.

Figure 14:
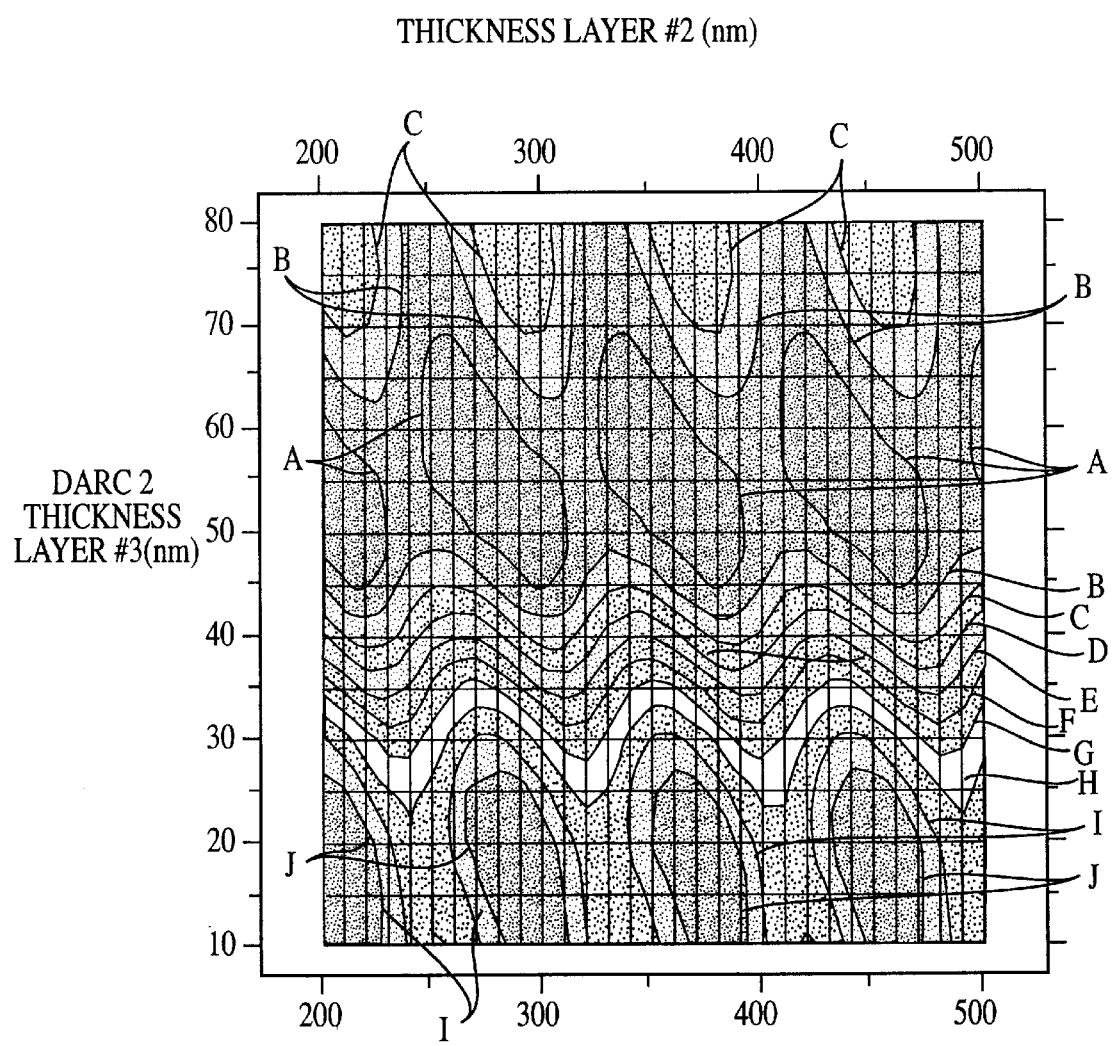
FIG. 14 is a contour diagram showing the performance of the single, thin anti-reflective coating layer in FIG. 10 over an alternate substrate material.

FIG. 14 is a contour diagram of a simulation showing the total reflectivity into the photoresist when the structure described above includes a single layer of DARC2 between the first and second layers of silicon dioxide. As before, the DARC2 coating has an approximate index of refraction n=2.0 and an approximate absorption k=0.3. In the simulations represented by FIG. 14, the thickness of the DARC2 coating is allowed to vaile between 10 nm and 80 nm, while the thickness of the second layer of silicon dioxide is allowed to vary between 200 and 500 nm.

The contours of FIG. 14 have the following values:

| Contour | Reflectivity |
| --- | --- |
| A | 0.055 |
| B | 0.102 |
| C | 0.149 |
| D | 0.196 |
| E | 0.243 |
| F | 0.290 |
| G | 0.337 |
| H | 0.384 |
| I | 0.431 |
| J | 0.478 |

As seen in FIG. 14, the reflectivity ranges from 0.055 to 0.478. As before, the reflectivity performance of the DARC2 coating is somewhat improved, but the overall variation in reflectivity performance is still large.

Figure 15:
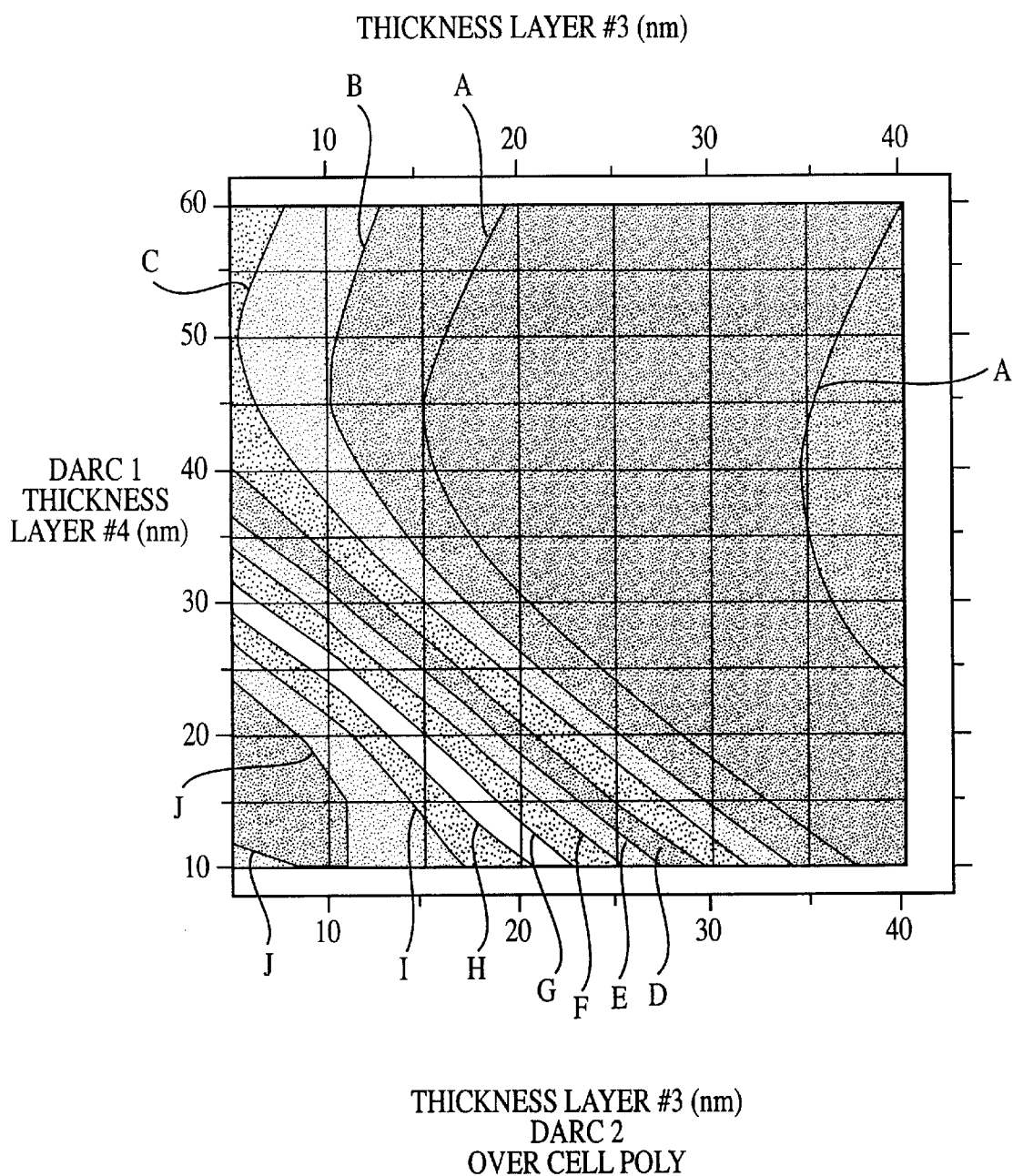
FIG. 15 is a contour diagram showing the performance of the dual, thin anti-reflective coating layers in FIG. 11 over an alternate substrate material.

FIG. 15 illustrates the results achieved through the use of two layers of anti-reflective coating. FIG. 15 is a contour diagram of a simulation showing the reflectivity of both DARC1 and DARC2 layers of anti-reflective coating sandwiched between two silicon dioxide layers. In FIG. 15, the DARC1 and DARC2 layers have the same n and k values as the layers in FIGS. 13 and 14. The thickness of the second silicon dioxide layer is fixed at 300 nm for the simulations depicted in FIG. 15. The DARC1 layer has a thickness ranging from 10 nm to 60 nm, while the DARC2 layer has a thickness ranging from 10 nm to 40 nm.

The contours of FIG. 15 have the following values:

| Contour | Reflectivity |
| --- | --- |
| A | 0.036 |
| B | 0.072 |
| C | 0.107 |
| D | 0.143 |
| E | 0.179 |
| F | 0.214 |
| G | 0.250 |
| H | 0.285 |
| I | 0.321 |
| J | 0.357 |

As before, use of dual anti-reflective coating layers of appropriate thicknesses provides significantly improved performance in reducing the amount of reflectivity with dielectric layers of fixed thickness above and below the anti-reflective coatings.

Figure 16:
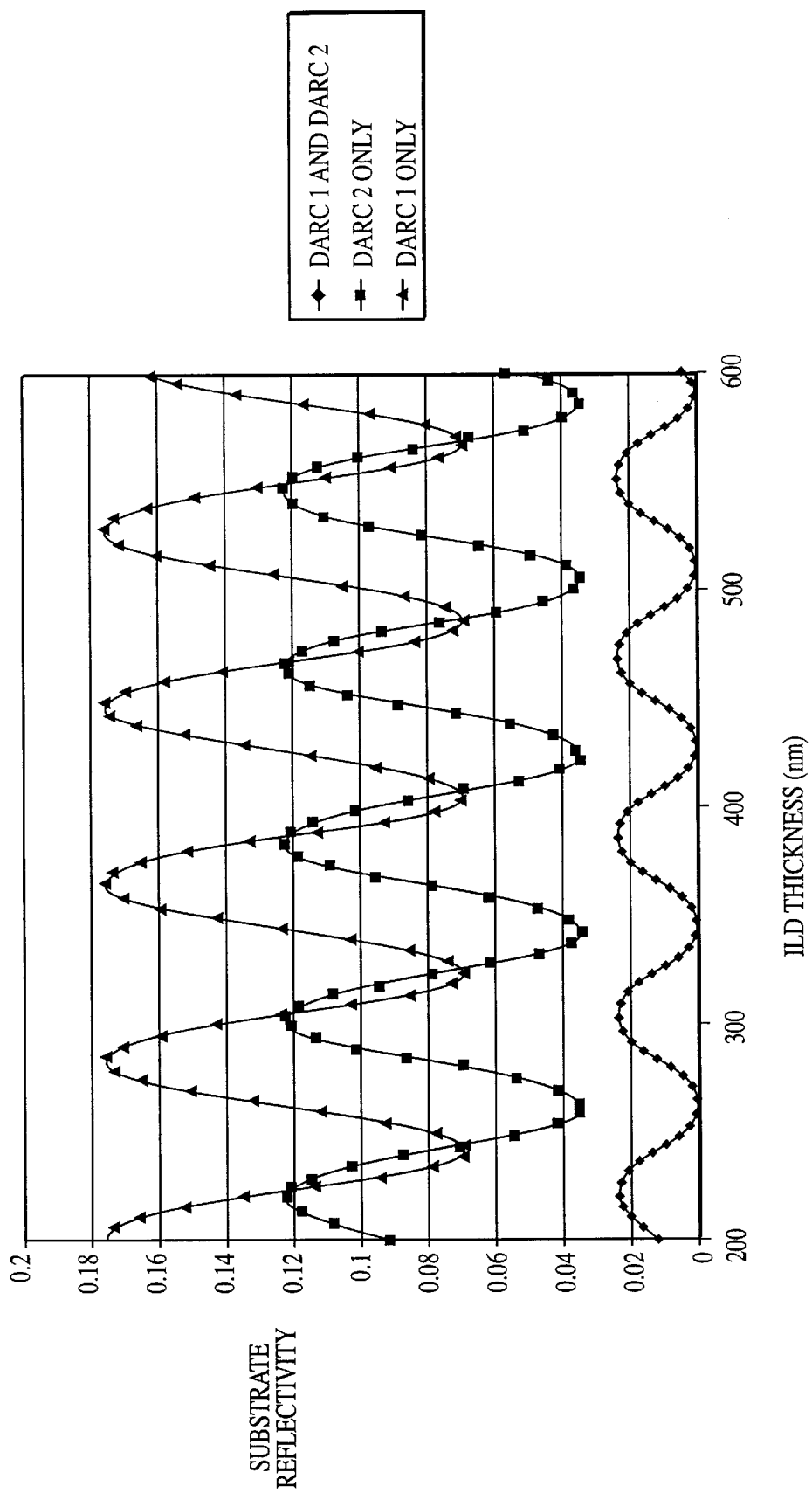
FIG. 16 shows a comparison of the performance of two different single, thin anti-reflective coating layers with the performance of dual, thin anti-reflective coating layers over an alternate substrate material.

FIG. 16 demonstrates that dual anti-reflective layers are also effective f(or reducing the impact of process variations in our sample structure involving a polysilicon layer. FIG. 16 depicts the changes in the calculated reflectivity for substrates similar to those modeled in FIGS. 13, 14, and 15. In FIG. 16, the thickness of the single DARC1 layer is 40 nm while the thickness of the single DARC2 layer is 25 nm. These same thicknesses are also used for the DARC1 and DARC2 layers present in the substrate having dual anti-reflective coatings. As in FIGS. 13 and 14, the thickness of the second dielectric layer is varied, but in FIG. 16 this variation is between 200 nm and 600 nm. FIG. 16 shows that dual anti-reflective coatings of an appropriate thickness once again provide improved performance that is largely independent of variations in the thickness of the second dielectric layer.

As seen from the results of FIGS. 9–16, use of dual anti-reflective coatings does not generally result in elimination of reflected radiation. Instead, the role of the dual anti-reflective coating layers is to reduce the magnitude of reflected radiation to a minimal level at the optimal coating thickness while minimizing the variations in reflected radiation caused by process variations. In other words, properly designed dual anti-reflective coating layers cause the amplitudes and phase differences of all reflected radiation to substantially mutually cancel. This includes radiation from all sources of reflected radiation located at or below the level of interface 19 in FIG. 2.

Figure 3:
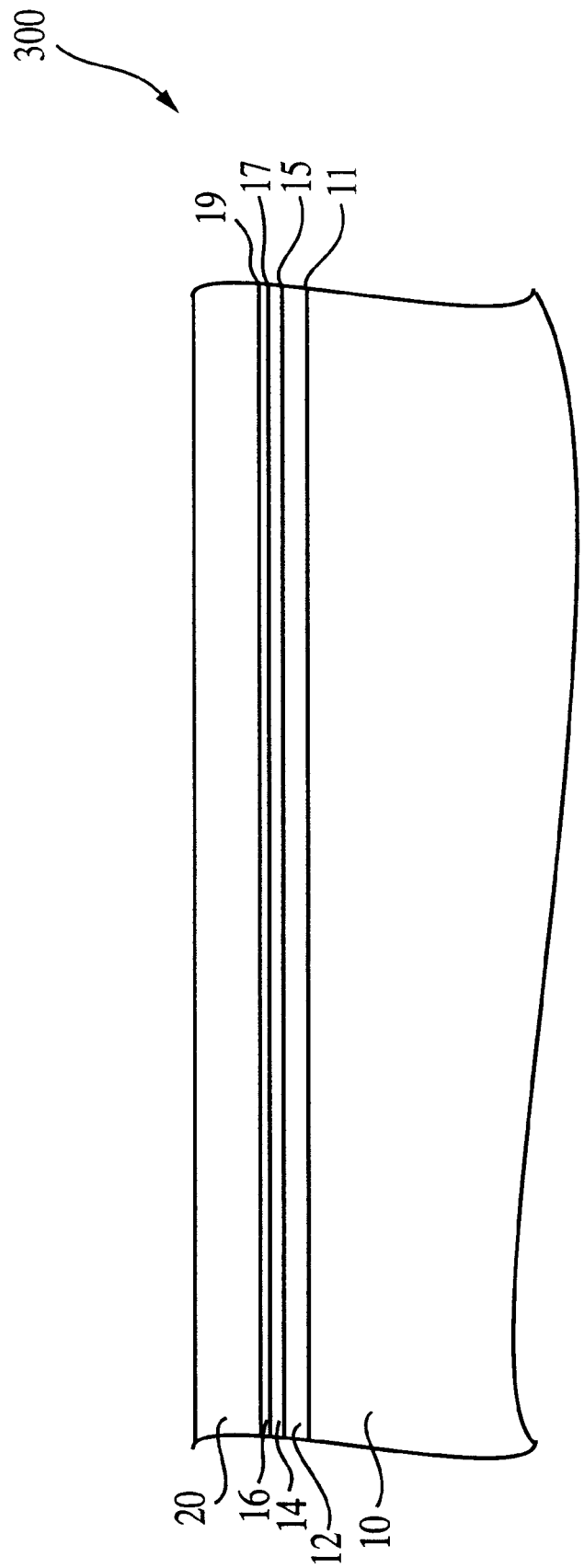
FIG. 3 is a cross-sectional diagram of a portion of a reflective layer with multiple layers of anti-reflective coating and a layer of photoresist according to a second embodiment of the invention.

FIG. 3 illustrates the use of three layers of anti-reflective coating 12, 14, 16 between a reflective layer 10 and a photoresist layer 20. The same principles that were discussed above in connection with the dual layers of anti-reflective coatings apply to three or more layers. The index of refraction of the upper layer 16 is chosen to match the index of refraction n of the photoresist 20, while the lower layer 12 is chosen to maximize the absorption k. The middle layer 14 is chosen such that is index of refraction is some value between the index of refraction of the upper and lower layers 16, 12. Additional layers could be also be added. The decision as to whether to use multiple layers involves trading off the increased process complexity and cost associated with using multiple layers with the increased performance.

Figure 4:
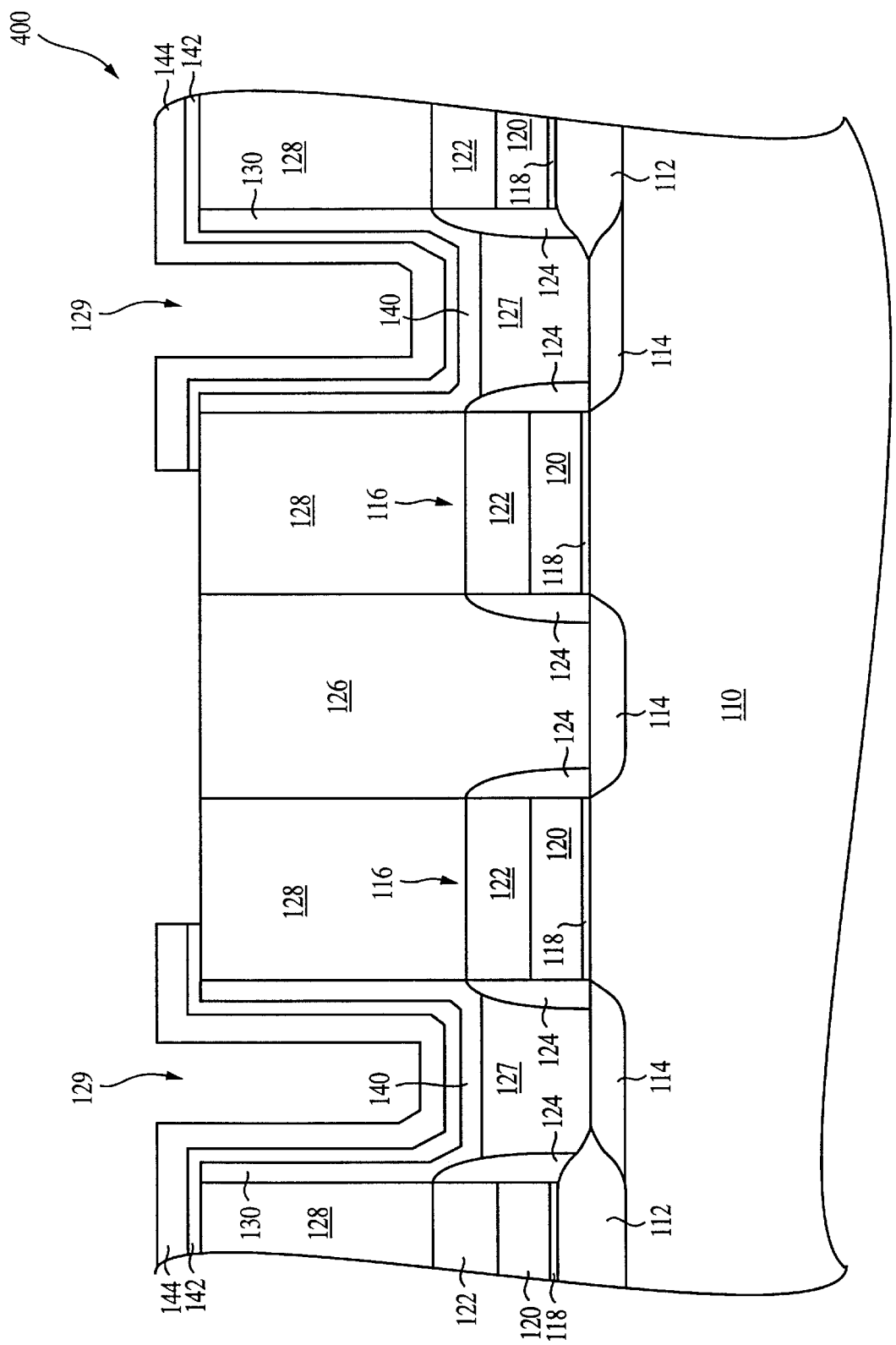
FIG. 4 is a cross-sectional view of a portion of an integrated circuit at an intermediate stage of processing according to a third embodiment of the invention.

The fabrication of an integrated circuit using a dual DARC layer shall now be illustrated. Referring now to FIG. 4, a portion of a semi-conductor wafer 400 at an intermediate stage of processing is shown. The portion 400 corresponds to a conventional dual DRAM cell configuration sharing a common bit line. Formed in a substrate 110 are field isolation regions 112 and active areas 114. Gate stacks 116 are formed between the active areas 114. The gate stacks 116 comprise a gate dielectric 118, a gate electrode 120, an insulating cap 122, and TEOS spacers 124. A bit line contact 126 is formed over the common active area 114 between the two gate stacks 116. Cavities 129 are formed in a BPSG (boro-phospho silicate glass) insulator layer 128. Container capacitors 130 are formed in the cavities 129. The container capacitors comprise a first conductive layer 140, a capacitor dielectric 142, and a second conductive layer 144. The first conductive layer 142 is in electrical contact with a conductive plug 127 comprised of a material such as doped polysilicon, which is in turn in electrical contact with an active area 114.

Figure 5:
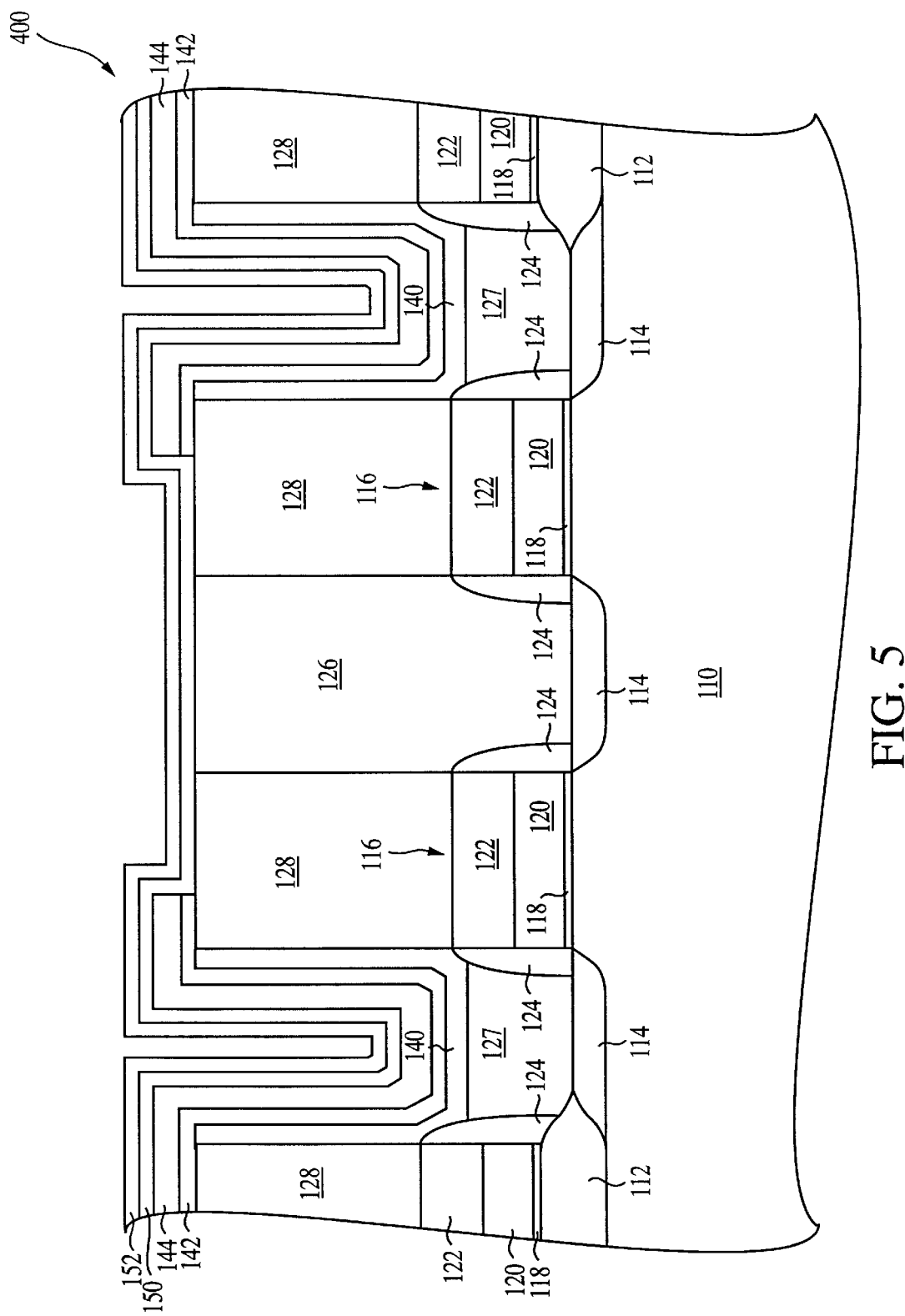
FIG. 5 is a cross-sectional view of the portion of the integrated circuit of FIG. 4 at a later stage of processing.
Figure 6:
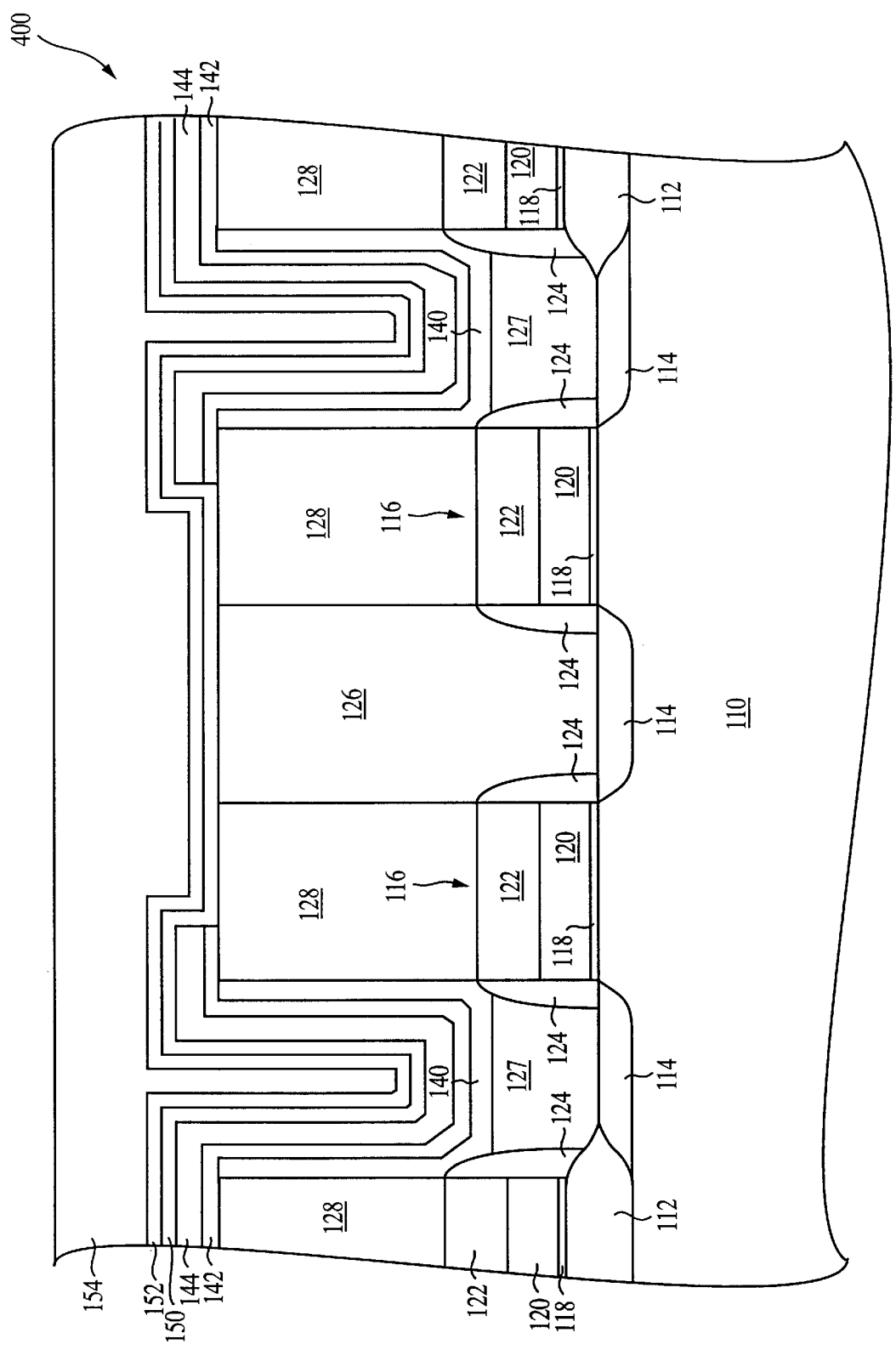
FIG. 6 is a cross-sectional view of the portion of the integrated circuit of FIG. 5 at a later stage of processing.
Figure 7:
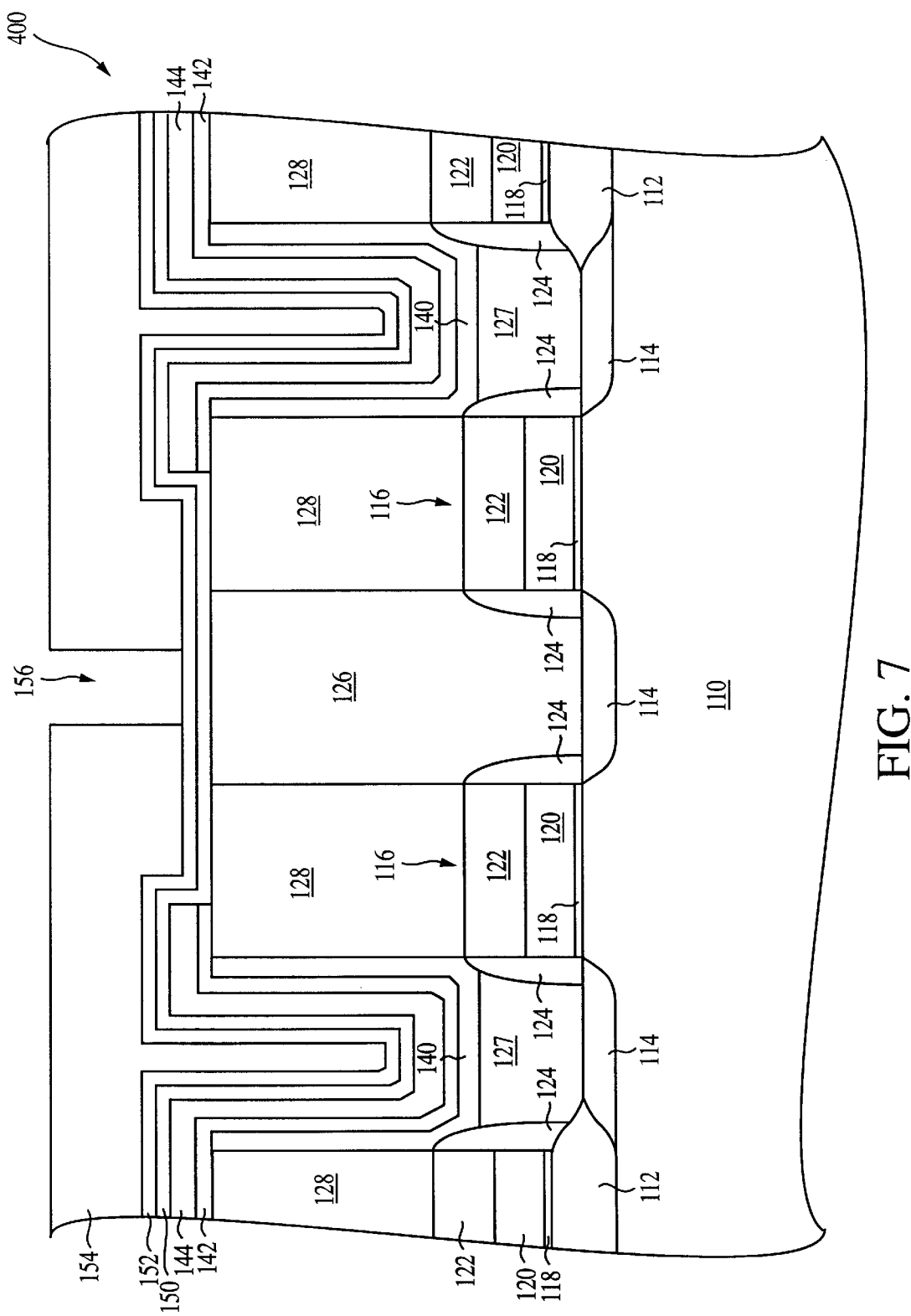
FIG. 7 is a cross-sectional view of the portion of the integrated circuit of FIG. 6 at a later stage of processing.
Figure 8:
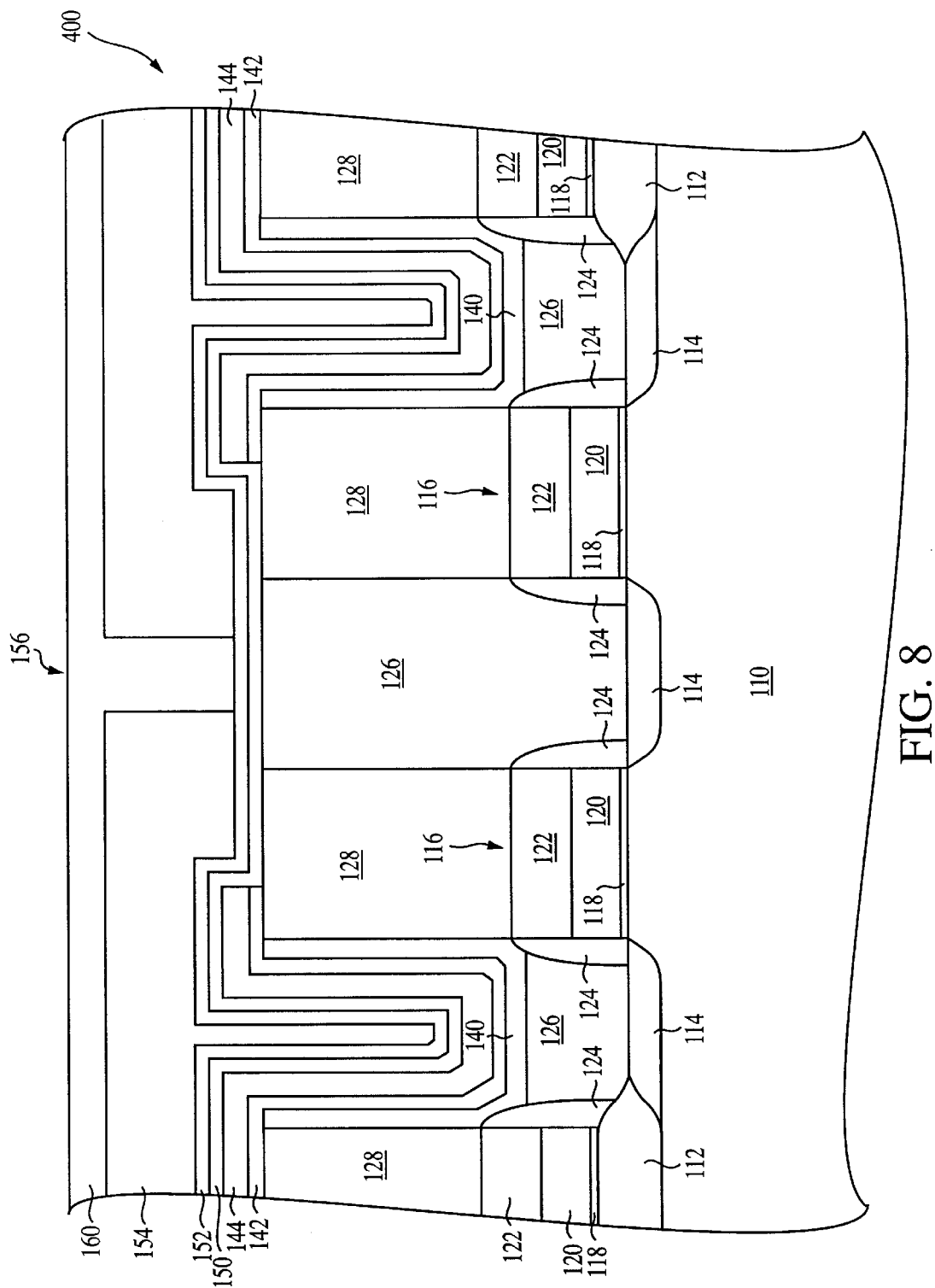
FIG. 8 is a cross-sectional view of the portion of the integrated circuit of FIG. 7 at a later stage of processing.

Referring now to FIG. 5, a lower layer 150 of DARC 150 is deposited over the structure of FIG. 4. As discussed above, the absorption of the lower layer 150 is optimized. All exemplary anti-reflective coating that could be used is the DARC1 coating discussed in connection with FIGS. 9–16. Then, a second layer 152 of DARC is deposited over the first layer. The index of refraction of the second layer 152 is chosen to be approximately equal to the index of refraction of BPSG. An exemplary anti-reflective coating that could be used for the second layer 152 is DARC2. Referring now to FIG. 6, an inter-level dielectric (ILD) layer 154 comprising BPSG or TEOS (tetraethylorthosilicate) based material is then deposited over the DARC layers 150, 152. Next, a bit-line opening 156 is created in the ILD layer 154. The opening 156 is created through a photolithography process. The DARC layers 150, 152 retard reflections of radiation from the complex topography below. Furthermore, the DARC layers 150, 152 act as an etch stop for the etch process used to create the opening 156 (the etchant used in the photolithography process is chosen to selectively etch the BPSG ILD layer 154 with respect to the DARC layers 150, 152). Then the DARC layers 150, 152, in the opening 156 which were exposed in the previous step, are themselves etched to expose the plug 126 and a metal layer 160 is deposited over the entire structure and into the bit-line opening 156 as shown in FIG. 8. The remaining steps, e.g. passivation, metallization, etc., are conventional and well known in the art and hence will not be described in further detail.

Those of skill in the art will recognize that it is also possible to provide an upper DARC layer 152 above the ILD layer 154 and a lower DARC layer 150 below the ILD layer 154. Further, it is possible to place both DARC layers 150, 152 above the ILD layer 154. In the latter situation, this arrangement could permit removal of the DARC layers after the pattern has been transferred to the ILD layer. However, in this latter situation, the DARC layers 150 and 152 cannot serve as an etch stop. In the former case, the lower DARC layer 150 could serve as an etch stop, but this would require a preliminary selective etch of the upper DARC layer 152 with respect to the ILD layer 154, followed by a second selective etch of the ILD layer 154 with respect to the lower DARC layer 150.

Figure 17:
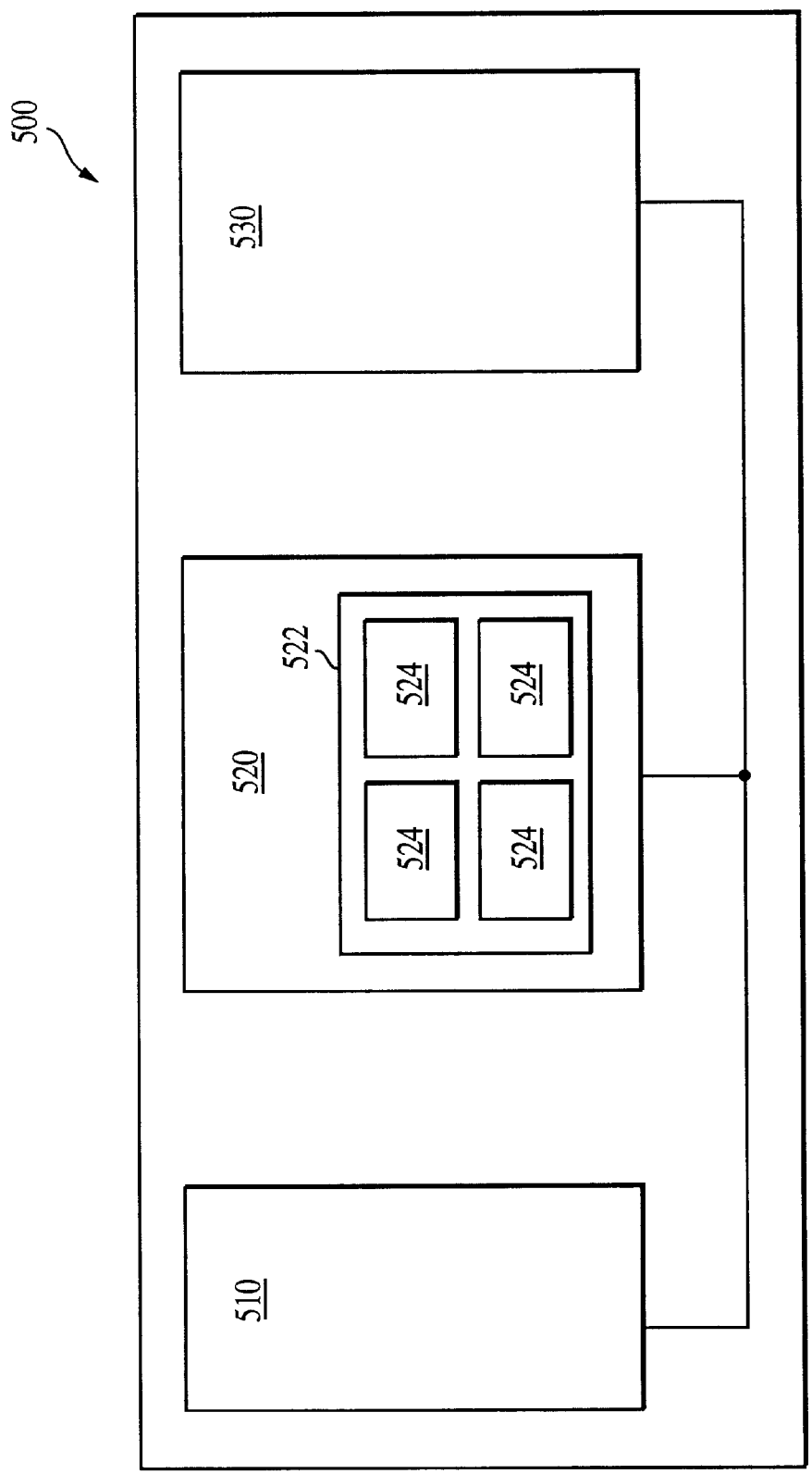
FIG. 17 is a block diagram of a computer system incorporating integrated circuits constructed according to the present invention.

FIG. 17 illustrates a computer system 500 including a processor 510, a memory 520 and an I/O device 530. The memory 520 comprises an array 522 of memory cells 524. The memory cells 524, other portions of the memory 522, the I/O device 530, and/or the processor 510 contain or comprise memory circuits fabricated according to one or more embodiments of the present invention.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A photolithography method comprising the steps of:
    depositing a first anti-reflective coating over a reflective surface, the first coating having a first index of refraction, a first absorption, an upper surface defining a first interface, and a first thickness;
    depositing a second anti-reflective coating at least partially on the upper surface of said first anti-reflective coating, the second anti-reflective coating having a second index of refraction, a second absorption, an upper surface defining a second interface, and a second thickness, wherein the first index of refraction is different from the second index of refraction;
    depositing a dielectric material over the second anti-reflective coating; and
    depositing a photoresist over the dielectric material.

2. The method according to claim 1, wherein the first index of refraction, the first absorption, and the first thickness are chosen such that the amplitude of radiation reflected from the first interface will be approximately equal to the amplitude of radiation reflected from the second interface and the phase difference between the radiation reflected from the first interface and the second interface will be approximately 180 degrees.

3. The method according to claim 1 further comprising the step of forming one or more additional anti-reflective coatings having additional indices of refraction, additional absorptions, additional thicknesses and additional reflective surfaces below the second interface.

4. The method according to claim 3, wherein the indices of refraction, absorptions, and thicknesses of the first anti-reflective coating and second anti-reflective coating are chosen such that the amplitudes and phase differences of radiation reflected from the first interface, second interface, and the additional reflective surfaces which reside below the second interface substantially mutually cancel when combined.

5. The method according to claim 3, wherein the indices of refraction, absorptions, and thicknesses of the first, second, and additional anti-reflective coatings are chosen such that the amplitudes and phase differences of all sources of reflected radiation which reside at or below the second interface substantially mutually cancel when combined.

6. The method according to claim 1, wherein the second anti-reflective coating is deposited on the entire upper surface of said first anti-reflective coating.

7. The method according to claim 1, wherein the photoresist is in contact with the second anti-reflective coating.

8. The method according to claim 1, wherein the dielectric material is boro-phospho silicate glass.

9. The method according to claim 1, wherein the dielectric material is tetracthylorthosilicate.

10. The method according to claim 1, wherein the reflective surface is formed of metal.

11. The method according to claim 1, wherein the reflective surface is formed of a metal silicide.

12. The method according to claim 1, wherein the reflective surface is formed of polysilicon.

13. The method according to claim 1, wherein the reflective surface is formed of an insulator.

14. The method according to claim 1, wherein the reflective surface is formed of silicon dioxide.

15. The method according to claim 1, wherein the first index of refraction is approximately 2.1, the second index of refraction is approximately 2.0, the first absorption is approximately 1.2, and the second absorption is approximately 0.3.

16. The method according to claim 1, further comprising exposing at least a portion of said photoresist to light of an appropriate wavelength to form a desired pattern in said photoresist layer.

17. A method for fabricating a memory cell, the method comprising the steps of:
    providing a substrate;
    forming a structure over the substrate, the structure comprising
    at least two active areas in the substrate;
    a gate stack between the active areas; and
    a capacitor in electrical contact with one of the active areas;
    depositing a first anti-reflective coating having a first index of refraction, a first absorption, a first thickness, and an upper surface defining a first interface over the structure;
    depositing a second anti-reflective coating having a second index of refraction, a second absorption, a second thickness, and an upper surface defining a second interface at least partially on the upper surface of said first anti-reflective coating;
    providing an insulating layer in contact with the second anti-reflective coating; and
    patterning the insulating layer using a photo-lithographic process, wherein the first index of refraction is different from the second index of refraction.

18. The method according to claim 17, wherein the indices of refraction, absorptions, and thicknesses of the first and second anti-reflective coatings are chosen such that the amplitudes and phase differences of all sources of reflected radiation which reside at or below the second interface substantially mutually cancel when combined.

19. The method according to claim 17, wherein the second anti-reflective coating is deposited on the entire upper surface of said first anti-reflective coating.

20. The method according to claim 17, wherein the insulating layer comprises boro-phospho silicate glass.

21. The method according to claim 17, wherein the insulating layer is tetraethylorthosilicate.

22. The method according to claim 17, wherein the patterning step comprises forming a layer of photoresist above the insulating layer, forming a desired pattern in the photoresist layer, and etching the insulating layer to transfer the desired pattern into the insulating layer.

23. The method according to claim 22, wherein the first or second anti-reflective coating is used as an etch stop during the etching.

24. The method according to claim 22, wherein the photoresist is in contact with the second anti-reflective coating.

25. The method according to claim 17, wherein the first index of refraction is approximately 2.1, the second index of refraction is approximately 2.0, the first absorption is approximately 1.2, and the second absorption is approximately 0.3.

26. The method according to claim 17, wherein the structure is a dual DRAM cell structure comprising first, second and third active areas, first and second gate stacks and first and second capacitors, the first gate stack being formed between the first and second active areas, the second gate stack being formed between the second and third active areas, the first capacitor being in electrical contact with the first active area, the second capacitor being in electrical contact with the third active area, and the second active area being in electrical contact with a bit line.

27. The method according to claim 26, wherein the capacitors are formed over the gate stacks.

28. The method according to claim 27, wherein the capacitors are container capacitors.

29. The method according to claim 26, wherein the bit line is formed over the capacitors.

30. A method for forming a memory cell, the method comprising the steps of:

depositing a first anti-reflective coating over a reflective surface;

depositing a second anti-reflective coating over and in contact with the first anti-reflective coating;

depositing a dielectric material over and in contact with the second anti-reflective coating; and etching the dielectric material, using the anti-reflective coating as an etch stop.

31. The method according to claim 30, further comprising forming a patterned layer of photoresist over the dielectric material before said etching step.

32. The method according to claim 31, wherein said etching step transfers the pattern from the patterned photoresist layer to the dielectric material.

* * * * *

UNITED STATES PATENT AND TRADEMARK OFFICE
CERTIFICATE OF CORRECTION

PATENT NO. : 6,331,379 B1
DATED : December 18, 2001
INVENTOR(S) : Phillip J. Ireland et al.

It is certified that error appears in the above-identified patent and that said Letters Patent is hereby corrected as shown below:

Column 1,
Line 22, change "DUW" to -- DUV --.

Column 5,
Lines 44-45, change "such the" to -- such as the --.

Column 6,
Line 2, change "all" to -- an --.

Column 7,
Line 34, change "DARC,2" to -- DARC2 --; and
Line 57, change "singe" to --single --.

Column 8,
Line 35, change "DARC 1" to -- DARC1 --; and
Line 65, change "vaile" to -- vary --.

Column 10,
Line 19, change "is" to -- its --; and
Line 48, change "All" to -- An --.

Column 12,
Line 25, change "tetracthylorthosilicate" to -- tetraethyorthosilicate --.

Signed and Sealed this

Twentieth Day of August, 2002

Attest:

JAMES E. ROGAN
Attesting Officer    Director of the United States Patent and Trademark Office